United States Patent
Umebayashi et al.

(10) Patent No.: US 9,595,562 B2
(45) Date of Patent: Mar. 14, 2017

(54) MEMORY CELL STRUCTURE, METHOD OF MANUFACTURING A MEMORY, AND MEMORY APPARATUS

(71) Applicant: SONY CORPORATION, Tokyo (JP)

(72) Inventors: Taku Umebayashi, Kanagawa (JP); Shunichi Sukegawa, Kanagawa (JP); Takashi Yokoyama, Kanagawa (JP); Masanori Hosomi, Tokyo (JP); Yutaka Higo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/029,038

(22) PCT Filed: Oct. 10, 2014

(86) PCT No.: PCT/JP2014/077172
§ 371 (c)(1),
(2) Date: Apr. 13, 2016

(87) PCT Pub. No.: WO2015/060144
PCT Pub. Date: Apr. 30, 2015

(65) Prior Publication Data
US 2016/0260774 A1    Sep. 8, 2016

(30) Foreign Application Priority Data
Oct. 22, 2013  (JP) ................ 2013-219424

(51) Int. Cl.
*H01L 27/22* (2006.01)
*H01L 27/12* (2006.01)
(Continued)

(52) U.S. Cl.
CPC ........ *H01L 27/228* (2013.01); *H01L 27/1203* (2013.01); *H01L 43/02* (2013.01); *H01L 43/12* (2013.01)

(58) Field of Classification Search
CPC ........ H01L 27/228; H01L 43/02; H01L 43/12
See application file for complete search history.

(56) References Cited

U.S. PATENT DOCUMENTS

| 2008/0099828 | A1* | 5/2008 | Heinrichsdorff ...... H01L 27/115 257/324 |
| 2010/0181547 | A1* | 7/2010 | Kuroda ................... H01L 21/74 257/2 |
| 2012/0286358 | A1* | 11/2012 | Sammi ............ H01L 21/823487 257/334 |

FOREIGN PATENT DOCUMENTS

| JP | 63-287054 A | 11/1988 |
| JP | 2002-329846 | 11/2002 |

(Continued)

OTHER PUBLICATIONS

International Search Report prepared by the Japanese Patent Office on Oct. 28, 2014, for International Application No. PCT/JP2014/077172.

(Continued)

*Primary Examiner* — Allison P Bernstein
(74) *Attorney, Agent, or Firm* — Sheridan Ross P.C.

(57) ABSTRACT

A memory cell structure, a method of manufacturing a memory, and a memory apparatus that conform a memory cell structure of an MRAM, which reduces resistance of drawn wiring to be connected to an MTJ, reduces an area of a memory cell, and avoids performance degradation of the MTJ due to heat are provided. A memory cell includes: a transistor with a first diffusion layer formed in a bottom portion of a concave portion, and a second diffusion layer formed in upper end portions of two opposing sidewall portions of the concave portion, to form channels at portions between the first and second diffusion layers in the two sidewall portions; and a memory element that is disposed below the first diffusion layer. The first diffusion layer is (Continued)

electrically connected to the memory element via a contact formed after the silicon substrate is thinned.

10 Claims, 16 Drawing Sheets

(51) Int. Cl.
 *H01L 43/02* (2006.01)
 *H01L 43/12* (2006.01)

(56) References Cited

FOREIGN PATENT DOCUMENTS

| | | |
|---|---|---|
| JP | 2010-171166 A | 8/2010 |
| JP | 2012-238642 A | 12/2012 |
| JP | 2013-161827 A | 8/2013 |

* cited by examiner

MEMORY CELL STRUCTURE, METHOD OF MANUFACTURING A MEMORY, AND MEMORY APPARATUS

CROSS REFERENCE TO RELATED APPLICATIONS

This application is a national stage application under 35 U.S.C. 371 and claims the benefit of PCT Application No. PCT/JP2014/077172 having an international filing date of 10 Oct. 2014, which designated the United States, which PCT application claimed the benefit of Japanese Patent Application No. 2013-219424 filed 22 Oct. 2013, the disclosures of which are incorporated herein by reference in their entirety.

TECHNICAL FIELD

The present disclosure relates to a memory cell structure, a method of manufacturing a memory having the memory cell structure, and a memory apparatus.

Patent Document 1: Japanese Patent Application Laid-open No. 2002-329846

BACKGROUND ART

Along the significant advancement of various information devices ranging from mobile terminals to high-capacity servers, further higher performance, i.e., high-degree of integration, high speed, and low power consumption are pursued also in elements such as memories and logics constituting those devices. In particular, the progress of semiconductor nonvolatile memories is striking, and a flash memory as a high-capacity file memory is increasingly prevailing while increasing momentum of overtaking a hard disk drive. On the other hand, in order to aim at development to a code storage or working memory and replace a NOR flash memory, a DRAM, and the like currently widely used, a FeRAM (Ferroelectric Random Access Memory), an MRAM (Magnetic Random Access Memory), a PCRAM (Phase-Change Random Access Memory), and the like are in the process of being developed. Some of them are already put into practical use.

Among those memories, the MRAM stores data depending on a magnetization direction of a magnetic body and thus enables rewrite at high speed and almost infinitely ($10^{15}$ times or more). The MRAM is already used in the fields of industrial automation, aircraft, and the like. The MRAM is expected to be developed in a code storage or working memory in the future because of its high-speed operation and reliability.

In recent years, in contrast to magnetic storage of a horizontal magnetic type, a perpendicular magnetic type that is suitable for reduction in area of a memory cell has been proposed. Due to responsiveness of data access (write/read) and being a nonvolatile RAM, a demand for replacement of a DRAM is conceived, but it is indispensable to reduce the size of a memory cell that is comparable to the DRAM, that is, reduce a bit unit price.

The MRAM is similar to a DRAM in the structure as a semiconductor memory, and has such a shape that a capacitor portion in the DRAM is replaced with an MTJ (Magnetic Tunnel Junction) element.

In the structure of the MRAM already mass-produced, a transistor for selecting each MTJ, a bit line, a word line, an MTJ, and a data line are laminated on a substrate in the stated order from the bottom. In other words, the MTJ is disposed on the almost uppermost layer of the element, and the word line and the bit line are formed as memory connecting wires in laminated wiring between elements, which is a second-half step (Back End Of Line) of semiconductor manufacturing. In the structure, after the memory connecting wires are formed, an MTJ to be a memory element is laminated on those connecting wires, and data line is then formed.

Specifically, the structure in which components from an access transistor (field-effect transistor) to an MTJ are drawn to the vicinity of the uppermost layer of the metal wires and then connected is the mainstream. In this case, since the bit line and the word line are drawn to the MTJ, the resistance of the bit line and the word line becomes large, and thus a current for rewriting the memory content of the MTJ cannot be increased. This becomes a problem in terms of current control. As one of methods for solving this problem, an attempt to make a perpendicular-type access transistor is performed (see Patent Document 1).

SUMMARY OF INVENTION

Problem to be Solved by the Invention

Incidentally, in the semiconductor structure of the MRAM, there is a demand to reduce the magnitude of wiring resistance of the bit line and the word line as much as possible. Further, the MRAM has a data line, which does not exist in the DRAM. So, if a data line is wired in a memory element, it is necessary to prevent the area of the memory element from being increased as much as possible. Additionally, the heat resistance of the MTJ is a problem. In other words, heat treatment in wiring of the word line and the like may cause performance degradation of the MTJ. This is required to be avoided.

In this regard, it is an object of the present disclosure to provide a memory cell structure of an MRAM, which reduces resistance of drawn wiring to be connected to an MTJ as a memory element, increases a current provided to the memory element, reduces an area of a memory cell, and also avoids performance degradation of the MTJ due to heat.

Means for Solving the Problem

First, according to the present disclosure, there is provided a memory cell structure including: a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions; and a memory element that is disposed below the first diffusion layer, the first diffusion layer being electrically connected to the memory element via a contact formed after the silicon substrate is thinned.

In such a manner, since the two opposing sidewalls of the concave portion are used as channels, the channel width more than twice as large as a normal transistor can be ensured. Additionally, since the memory element is disposed below the first diffusion layer, the formation of the memory element can be performed after the formation of metal wires.

Second, in the above-mentioned memory cell structure according to the present disclosure, it is desirable that the first diffusion layer be electrically insulated by an insulating film and a substrate concentration profile for each memory cell.

In such a manner, since electrical isolation is provided by the insulating film and the substrate concentration profile, an operation failure does not occur.

Third, in the above-mentioned memory cell structure according to the present disclosure, it is desirable that the contact have a structure insulated from the silicon substrate.

In such a manner, since the contact has a structure insulated from the silicon substrate, an operation failure does not occur.

Fourth, in the above-mentioned memory cell structure according to the present disclosure, the silicon substrate can be an SOI (silicon on insulator) substrate.

In such a manner, since the silicon substrate is an SOI substrate, RIE (Reactive Ion Etching) can be stopped at high accuracy at a predetermined position of the silicon substrate, and a forming process can be made more reliable and stable.

Fifth, in the above-mentioned memory cell structure according to the present disclosure, it is desirable that the memory element be an MTJ (Magnetic Tunnel Junction) element. This realizes a memory cell structure that is suitable in an MRAM using an MTJ element.

According to the present disclosure, first, there is provided a method of manufacturing a memory having a memory cell structure including a transistor and a memory element, the transistor using a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, the memory element being disposed below the first diffusion layer, the first diffusion layer being electrically connected to the memory element via a contact formed after the silicon substrate is thinned, the method including the step of forming an intermediate laminated body as a part of the memory cell structure by performing at least the steps of: forming field isolation layers at a predetermined depth of the silicon substrate; forming the groove-shaped concave portion between the field isolation layers; forming the first diffusion layer in the bottom portion of the concave portion; forming the second diffusion layer in the upper end portions of the sidewall portions of the concave portion; and forming a metal wire in an upper portion of the second diffusion layer.

In such a manner, since the step of forming a metal wire in an upper portion of the second diffusion layer is included, a connection from the transistor to the memory element can be shortened.

Second, in the above-mentioned method of manufacturing a memory cell according to the present disclosure, it is desirable to include the steps of: bonding another silicon substrate as a support substrate to the silicon substrate on which the intermediate laminated body is formed; and thinning the silicon substrate.

In such a manner, since the step of bonding another silicon substrate as a support substrate to the silicon substrate is included, it is possible to thin the silicon substrate and easily form a contact on the back surface of the silicon substrate.

Third, in the above-mentioned method of manufacturing a memory cell according to the present disclosure, it is desirable to include the step of forming a contact from the first diffusion layer formed on the thinned silicon substrate.

In such a manner, since the contact is formed from the bottom portion of the first diffusion layer on the back side, a distance between the transistor and the memory element can be shortened.

Forth, in the above-mentioned method of manufacturing a memory cell according to the present disclosure, it is desirable to include the step of forming a memory element electrically connected to the first diffusion layer by the contact. Thus, a structure required as a memory cell is formed.

According to the present disclosure, there is provided a memory apparatus including: a memory cell including a memory element that holds information depending on a magnetization state of a magnetic body; and two types of wires mutually intersect and other types of wires. The memory cell has a memory cell structure including a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, and the memory element that is disposed below the first diffusion layer, the first diffusion layer being electrically connected to the memory element via a contact formed after the silicon substrate is thinned, the memory element being provided to a current between the two types of wires via the transistor.

In this case, the transistor has the two opposing sidewalls of the concave portion as channels, and thus the channel width more than twice as large as a normal transistor can be ensured, and a memory apparatus including a memory cell with a high current capability can be formed.

Effects of the Invention

According to the present disclosure, since the connection from the transistor to the memory element can be shortened, connection resistance can be made small. Since the two opposing sidewalls of the concave portion are used as channels, the channel width of the transistor is increased. This can increase a current provided to the memory element, and also reduce an area of a memory cell.

Additionally, since the memory element can be formed after the metal wire is formed, the influence by heat treatment of the metal wire can be suppressed.

It should be noted that the effects described herein are not necessarily limited and any effects described in the present disclosure may be produced.

BRIEF DESCRIPTION OF DRAWINGS

FIG. 4 is a diagram showing a current flow when a transistor within the memory cell according to the embodiment is turned on.

MODE(S) FOR CARRYING OUT THE INVENTION

Hereinafter, an embodiment of the present disclosure will be described in the following order.
<1. Comparison between Circuits of MRAM and DRAM>
<2. Layout Design of Upper Portion of Memory Cell>
<3. Memory Cell Structure of Embodiment>
<4. Method of Manufacturing Memory Cell of Embodiment>
<5. Modified Example>

1. Circuit Configurations of MRAM and DRAM

First, circuit configurations of an MRAM and a DRAM will be described with reference to FIG. 1.

Figure 1:
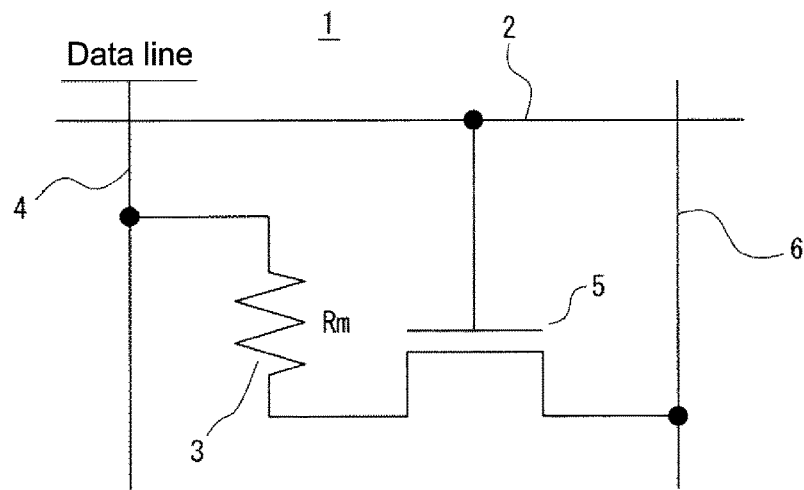
FIG. 1 is a diagram showing a circuit configuration of a memory cell of each of an MRAM and a DRAM.
Figure 1:
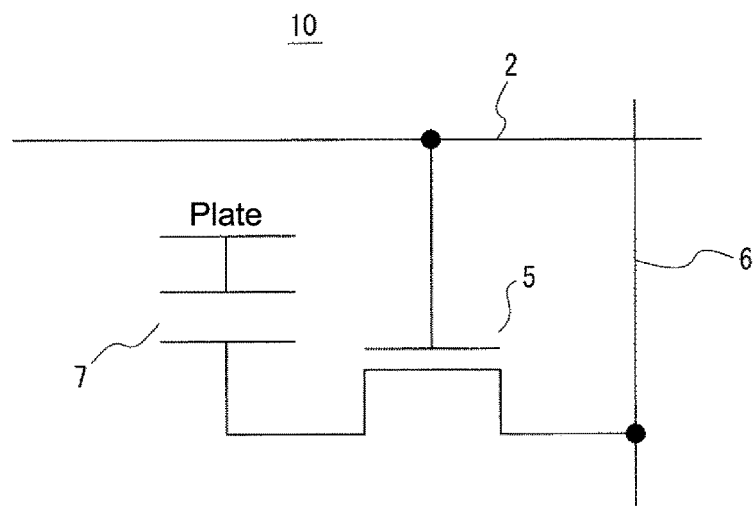

Part A of FIG. 1 shows a circuit configuration of a memory cell 1 of an MRAM. As shown in part A of FIG. 1, the memory cell 1 of the MRAM is constituted by an MTJ element 3 (Rm), an access transistor 5, a word line 2, a bit line 6, and a data line 4.

The MTJ element 3 has a function as a memory element for storing information. In general, the MTJ element 3 has a structure including two ferromagnetic and an insulating layer sandwiched therebetween.

Of the two ferromagnetic layers, magnetization of one ferromagnetic layer is fixed, and magnetization of the other ferromagnetic layer is variable. A thin insulating layer as a barrier is located between the ferromagnetic layers. A magnetization direction of the one magnetic layer is fixed and that of the other magnetic layer is changed, and due to a difference between resistance values thereof, information is thus held. When the two magnetic layers are different in magnetization orientation, resistance is high, and when the two magnetic layers have the same magnetization orientation, resistance is low. A current is provided to the MTJ element 3 and detected, and thus memory content (1 or 0) can be read.

The access transistor 5 plays a role of a switch on whether a current is provided to the MTJ element 3 of each memory cell 1 or not. When the access transistor 5 is turned on, a current can be provided to the MTJ element 3. In other words, it is possible to access the MTJ element 3. When the access transistor 5 is turned off, a current can be stopped to be provided to the MTJ element 3. In other words, it is possible to cancel the access to the MTJ element 3.

The word line 2 controls on and off of the access transistor 5. The word line 2 is connected to a gate electrode of the access transistor 5. When a voltage is applied to the word line 2, the voltage of the gate electrode becomes constant and a corresponding access transistor 5 can thus be turned on.

The bit line 6 supplies a constant voltage to a source of the access transistor 5.

The data line 4 is connected to be paired with the bit line 6. This can make a current path between the bit line 6 and the data line 4.

If the access transistor 5 is turned on, a current is provided between the bit line 6 and the data line 4, and thus a constant current can be provided to the MTJ element 3. This makes it possible to detect a resistance value of the MTJ element 3 and read memory content. Alternatively, when a spin current is provided, information can be written.

In contrast to this, as shown in part B of FIG. 1, a memory cell 10 of a DRAM has a circuit configuration constituted by a capacitor 7, an access transistor 5, a word line 2, and a bit line 6.

In this configuration, the MTJ element 3 of the memory cell 1 of the MRAM is replaced with the capacitor 7. Actually, the capacitor 7 corresponds to a memory element, and information is stored depending on the presence or absence of charge stored therein.

Further, a portion corresponding to the data line 4 is a plate. The plate is a plate-shaped electrode and does not need to be wired as the data line 4 in each memory cell 1 as in the MRAM. In other words, this is advantageous in terms of reduction in memory cell size.

However, in lamination of the memory cell 1 of the MRAM, a wiring layer of the data line 4 has to be laminated without fail, and this is inconvenient in terms of reduction in memory size.

2. Layout of Upper Portion of Memory Cell

Figure 2:
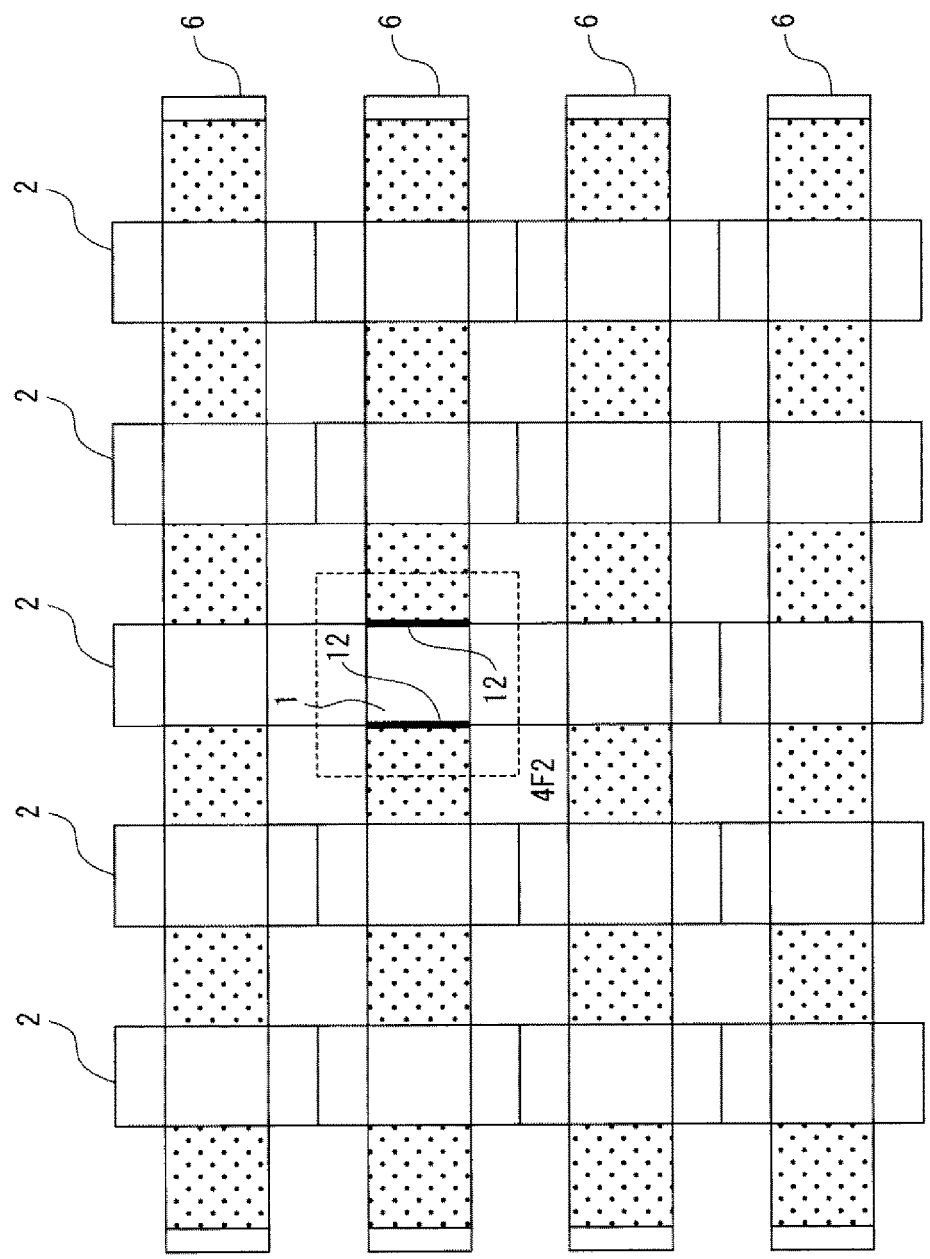
FIG. 2 is a diagram showing a structure of a top surface of the memory cell according to the embodiment.

Hereinafter, a layout of the memory cell 1 of the MRAM according to the embodiment will be described with reference to FIG. 2. FIG. 2 is a diagram schematically showing a structure of a memory cell array according to the embodiment when viewed from the top. As shown in FIG. 2, a plurality of word lines 2 is wired in a vertical direction and a plurality of bit lines 6 is wired in a lateral direction such that the word lines 2 and the bit lines 6 intersect mutually. The memory cell 1 is provided at a center position of an intersection of the word line 2 and the bit line 6. As shown in the figure, a feature size of the memory cell 1 is 2F×2F=4F2. In this embodiment, channels 12 of the access transistor 5 are formed on sidewalls of both sides of each word line 2. When the sidewalls of the both sides of the word line 2 running in the vertical direction are used as the channels 12, it is easy to earn an effective channel width and ensure a current capability. In the figure, when a channel having each side of F is used on both sides, a channel width corresponding to 2F is earned.

In the case where the size of the memory cell 1 is extended in a vertical direction with respect to the figure, it is possible to earn an effective channel width of 3F in a memory cell size of 5F2 or 4F in a memory size of 6F2.

3. Memory Cell Structure of Embodiment

Figure 3:
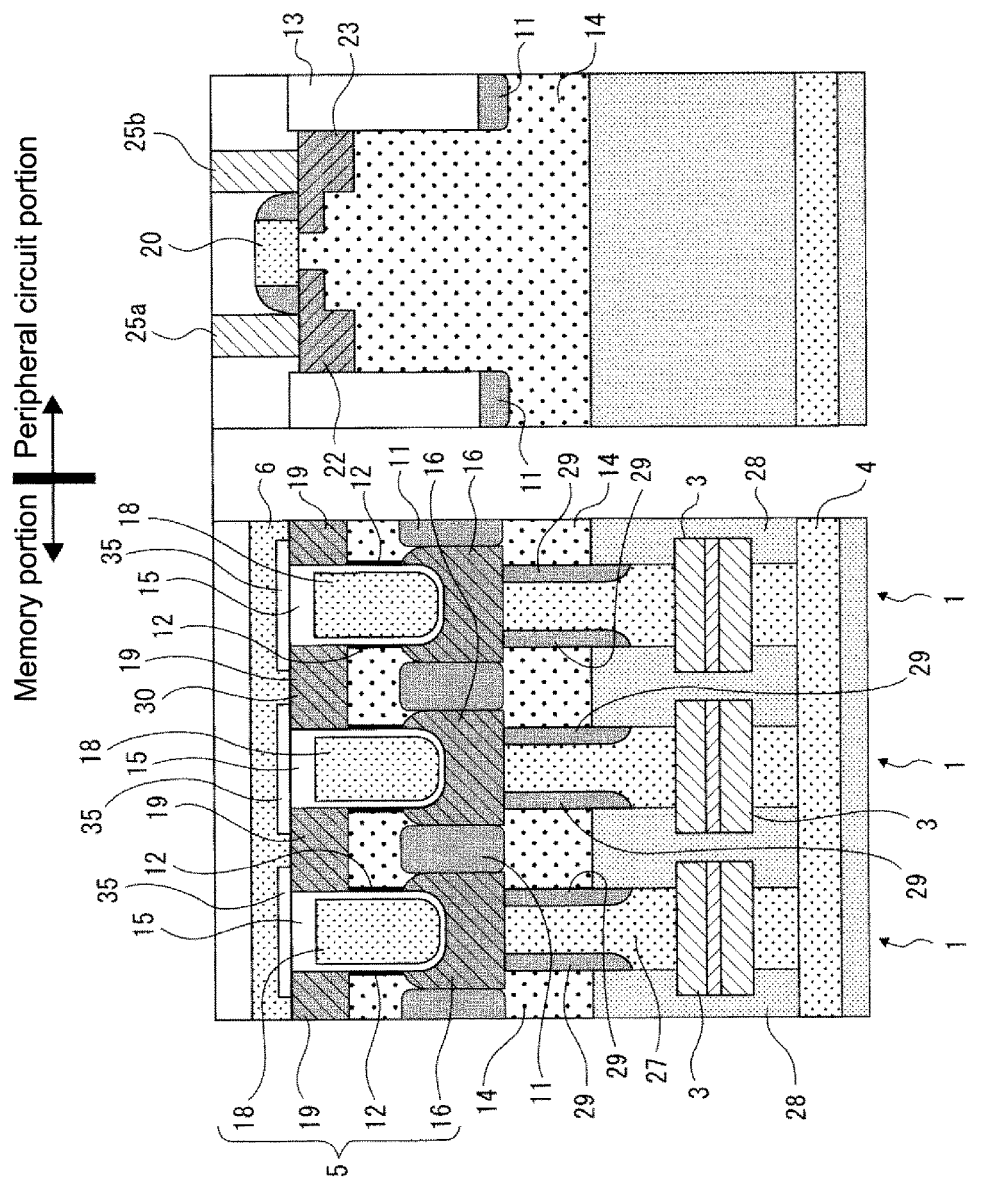
FIG. 3 is a diagram showing a layer structure of the memory cell according to the embodiment.

Hereinafter, a memory cell structure according to the embodiment and its peripheral circuit portion will be described with reference to FIG. 3. FIG. 3 is a diagram showing a layer structure of the memory cell according to the embodiment. The memory cell 1 according to this embodiment includes the MTJ element 3, the access transistor 5, the word line 2, the bit line 6, and the data line 4. FIG. 3 shows a portion in which three memory cells 1 are formed.

In a silicon substrate 14, a concave portion 15 is formed into a groove shape. In the concave portion 15, a gate electrode 18 is embedded. The gate electrode 18 is connected to the word line 2 (not shown).

The access transistor 5 is constituted by a first diffusion layer 16, a second diffusion layer 19, the gate electrode 18, and channels 12. The first diffusion layer 16 corresponds to a drain of the access transistor 5. Further, the second diffusion layer 19 corresponds to a source thereof.

As shown in the figure, the access transistor 5 has a configuration in which the first diffusion layer 16 is formed on the bottom portion of the portion 15 formed by processing the silicon substrate 14 to have a groove shape, the second diffusion layer 19 is formed on the upper end portions of two opposing sidewall portions of the concave portion 15, and the first diffusion layer 16 and the second diffusion layer 19 are used to form the channels 12 in the two sidewall portions at a portion between the first diffusion layer 16 and the second diffusion layer 19.

In such a manner, the second diffusion layer 19 is formed above the channels 12, and the access transistor 5 has a source-drain path in a perpendicular direction.

On both sides of the first diffusion layer 16, field isolation layers 11 made of a silicon oxide film or the like as a material are formed. Thus, the first diffusion layer 16 is isolated for each memory cell 1.

In the lower portion of the first diffusion layer 16, the silicon substrate 14 is thinned to form a back contact 27. The back contact 27 is formed of a copper plug, a tungsten plug, or the like. It is desirable that the back contact 27 be extracted at low resistance. The back contact 27 has a relatively low aspect ratio and is directly drawn from the first diffusion layer 16, and thus resistance can be made about ¼ to ⅕ lower than a general one.

Protective insulating films 29 are formed on both sides of the back contact 27. Additionally, a substrate concentration profile of the silicon substrate 14 is adjusted. This is also because electrical insulation of the first diffusion layer 16 is obtained for each memory cell 1.

The MTJ element 3 is formed as a memory element on the lower portion of the back contact 27. A back insulating layer 28 is formed on both sides of the MTJ element 3. The data line 4 is laminated below the lower portion of the MTJ element 3. The lamination of the data line 4 is performed after the MTJ element 3 is formed, and a process by low-heat processing is made possible. Thus, characteristic degradation of the MTJ element 3 due to heat can be avoided.

The data line 4 is disposed to be parallel to the bit line 6. This enables two lines to be collected to one side on a plane, and thus an increase in cell area can be suppressed.

Here, a current flow in an operating state of the memory cell structure will be described with reference to FIG. 4.

Figure 4:
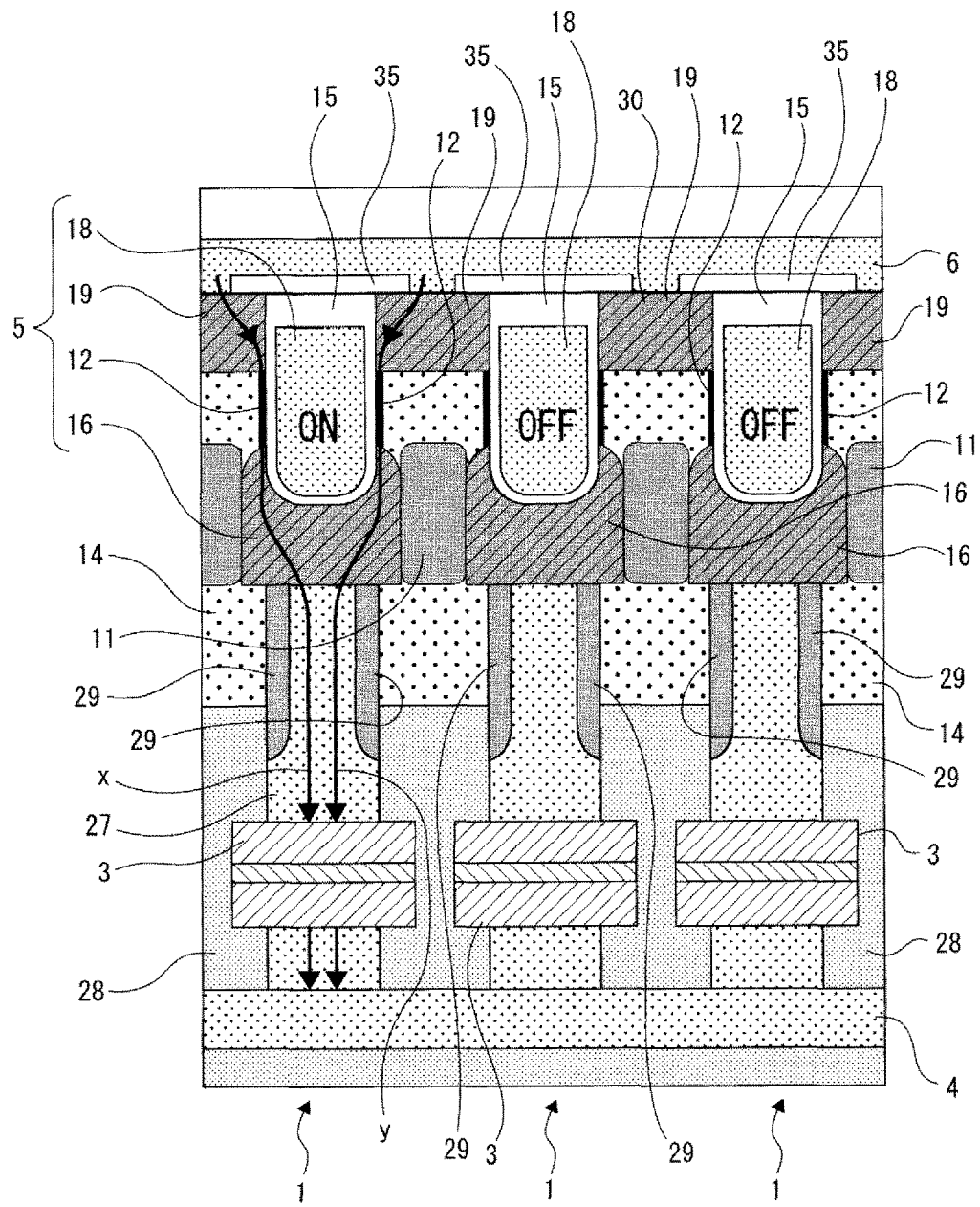

FIG. 4 shows a state where the leftmost access transistor 5 is turned on and the other transistors are turned off. As described above, the access transistor 5 is constituted by the first diffusion layer 16, the second diffusion layer 19, the gate electrode 18, and the channels 12. Turning the access transistor 5 on means turning the gate electrode 18 on (applying a constant voltage), and thus a corresponding gate electrode 18 is shown as ON. The other gate electrodes are shown as OFF. When the gate electrode is turned on, the channels 12 enter a conductive state.

Therefore, when power is supplied from the bit line 6 in this state, a current is provided from the second diffusion layer 19 (source) to the first diffusion layer (drain) via the channels 12, and further supplied to the data line 4 via the MTJ element 3. At that time, the current flows via the two channels 12 on the opposing sidewalls of the concave portion 15. In other words, the current flow in the operating state of the memory cell 1 includes a current flow in a path x and a current flow in a path y, as shown in the figure.

This can effectively earn a channel width and provide a large amount of current, and also enables read of memory content and write of information from and in the MTJ element 3.

The peripheral circuit portion has a configuration similar to a general memory apparatus. As shown in FIG. 3, a transistor constituted by a source 22, a gate electrode 20, and a drain 23 parallel to the silicon substrate 14 is formed. A connection wire 25a is drawn from the source 22. A connection wire 25b is drawn from the drain 23. Each transistor is electrically isolated by element isolation regions 13. On the lower portion of the element isolation region 13, a field isolation layer 11 in which a silicon oxide film or the like is embedded is formed.

4. Method of Manufacturing Memory Cell of Embodiment

Hereinafter, a method of manufacturing a memory cell according to the embodiment will be described with reference to FIGS. 5 to 15 and FIG. 3.

Figure 5:
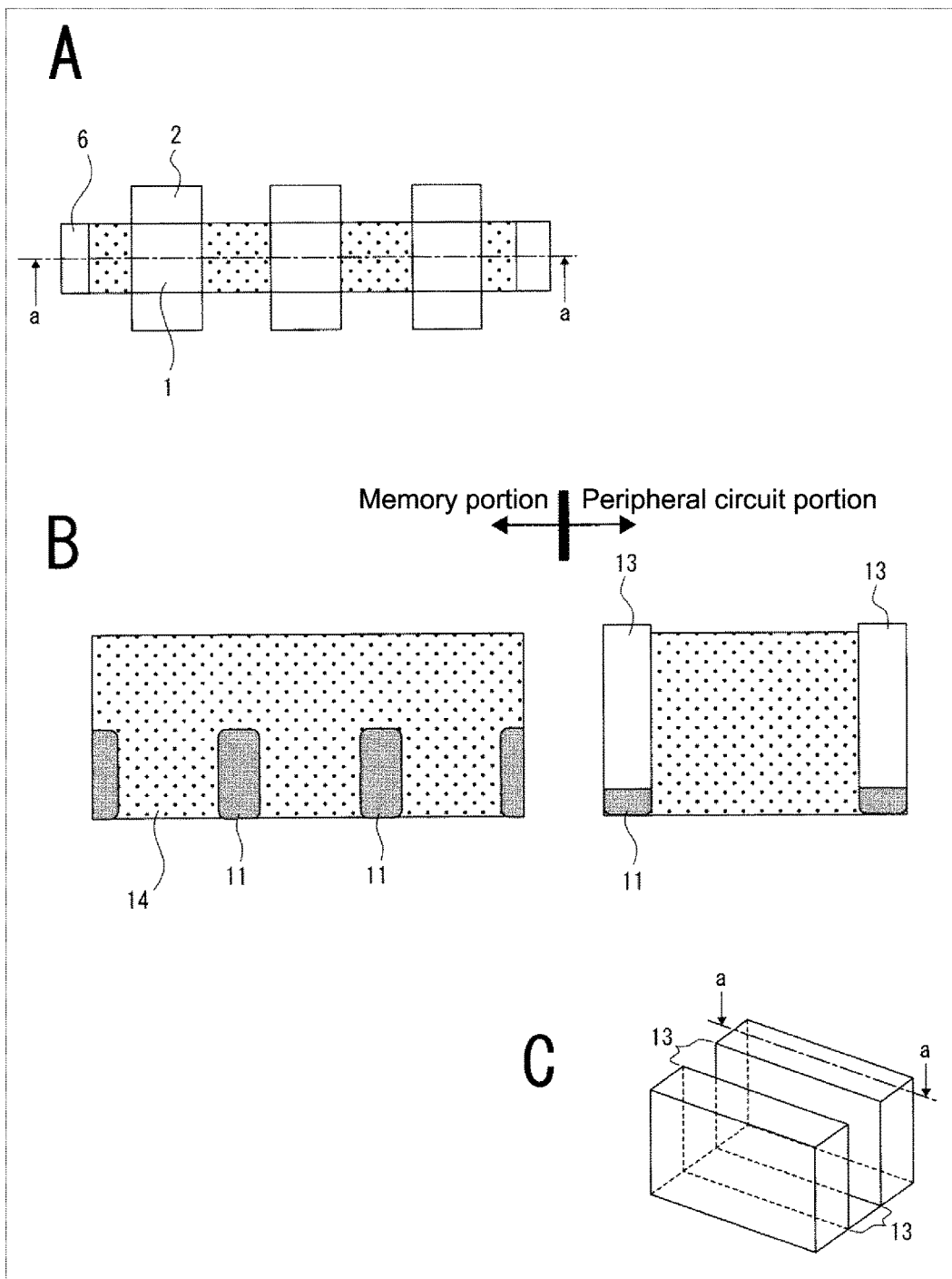
FIG. 5 is a diagram showing a layer structure in a state where an isolation region of each cell of the memory cell according to the embodiment is formed.

FIG. 5 is a diagram showing a layer structure in a state where an isolation region of each cell of the memory cell according to the embodiment is formed.

Part A of FIG. 5 is a diagram of the memory cell 1 according to the embodiment when viewed from the top. Here, a part excerpted from FIG. 2 is shown, and a portion to be the bit line 6 in a horizontal direction and portions to be the word lines 2 are shown. As described above, the memory cell 1 is formed at a center position of an intersection of the word line 2 and the bit line 6.

Part B of FIG. 5 shows a cross-sectional diagram taken along the line a-a. As shown in part B of FIG. 5, first, in the bottom portion of the silicon substrate 14 that is to be the first diffusion layer 16 in the future, the field isolation layers 11 are formed by ion implantation so as to electrically isolate each memory cell 1 at a position having the depth of approximately 200 to 400 nm, for example. The field isolation layer 11 is formed of a silicon oxide film or the like. In the case where a silicon oxide film is formed, oxygen is injected into the silicon substrate 14 at high energy and high density, and then heat treatment is performed. Thus, a silicon oxide film can be formed in the depth of the silicon substrate 14.

As shown in a bird's eye view of part C of FIG. 5, the element isolation region 13 is formed in a portion other than the silicon substrate 14 immediately below a portion to be the bit line 6 in the future. The field isolation layer 11 is formed in the lower portion of the element isolation region 13. The field isolation layer 11 is constituted by a silicon oxide film or the like.

By the above procedure, the element isolation regions 13 of the peripheral circuit portion can also be formed at the same time.

Figure 16:
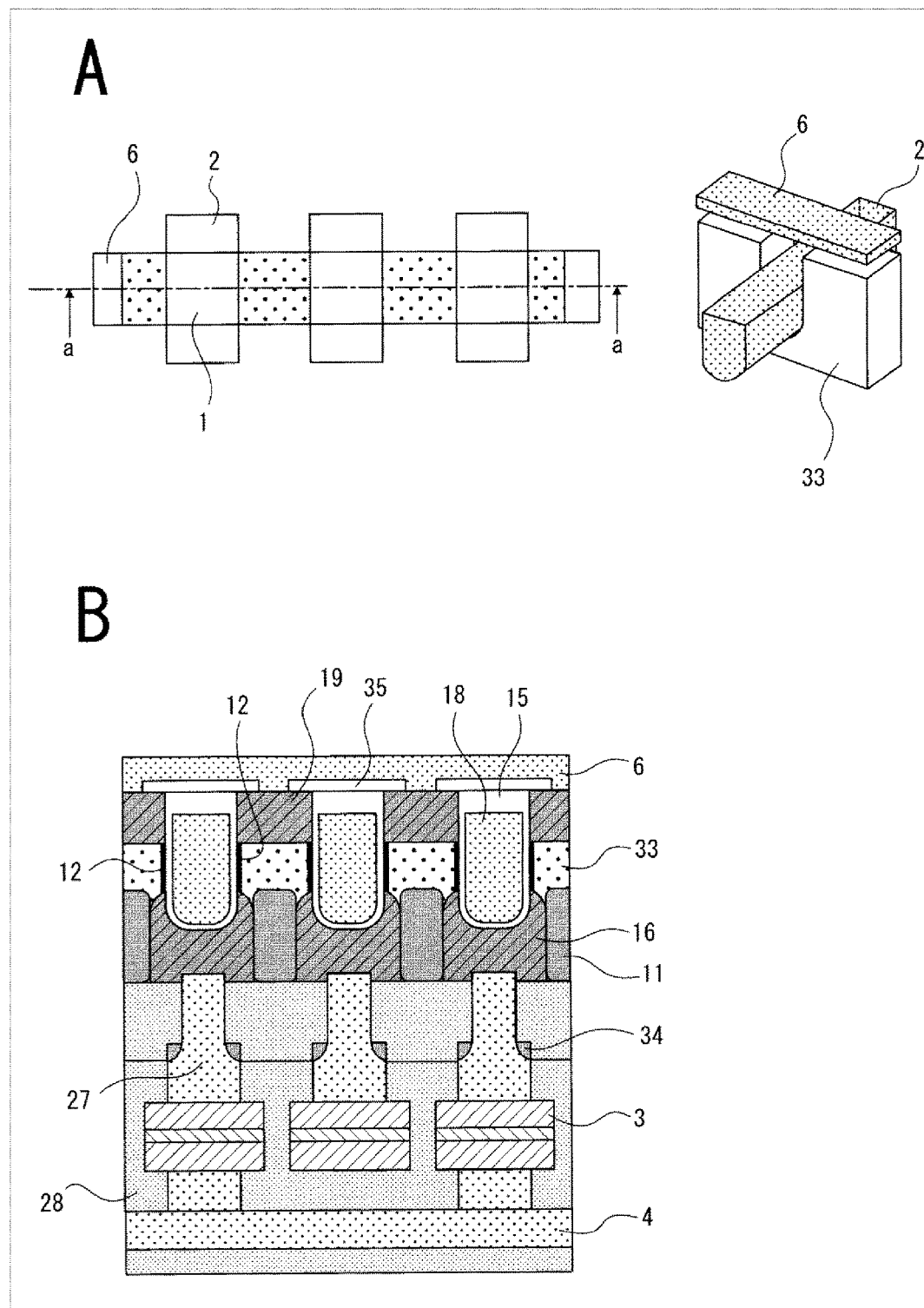
FIG. 16 is a diagram showing a modified example of a memory cell structure according to the embodiment.

In description on subsequent manufacturing processes, part B of each figure shows an a-a cross section of part A thereof. In other words, part B of FIG. 6 to part B of FIG. 11 and part B of FIG. 14 to part B of FIG. 16 show a-a cross sections of part A of FIG. 6 to part A of FIG. 11 and part A of FIG. 14 to part A of FIG. 16, respectively, as in the case of FIG. 5.

Figure 6:
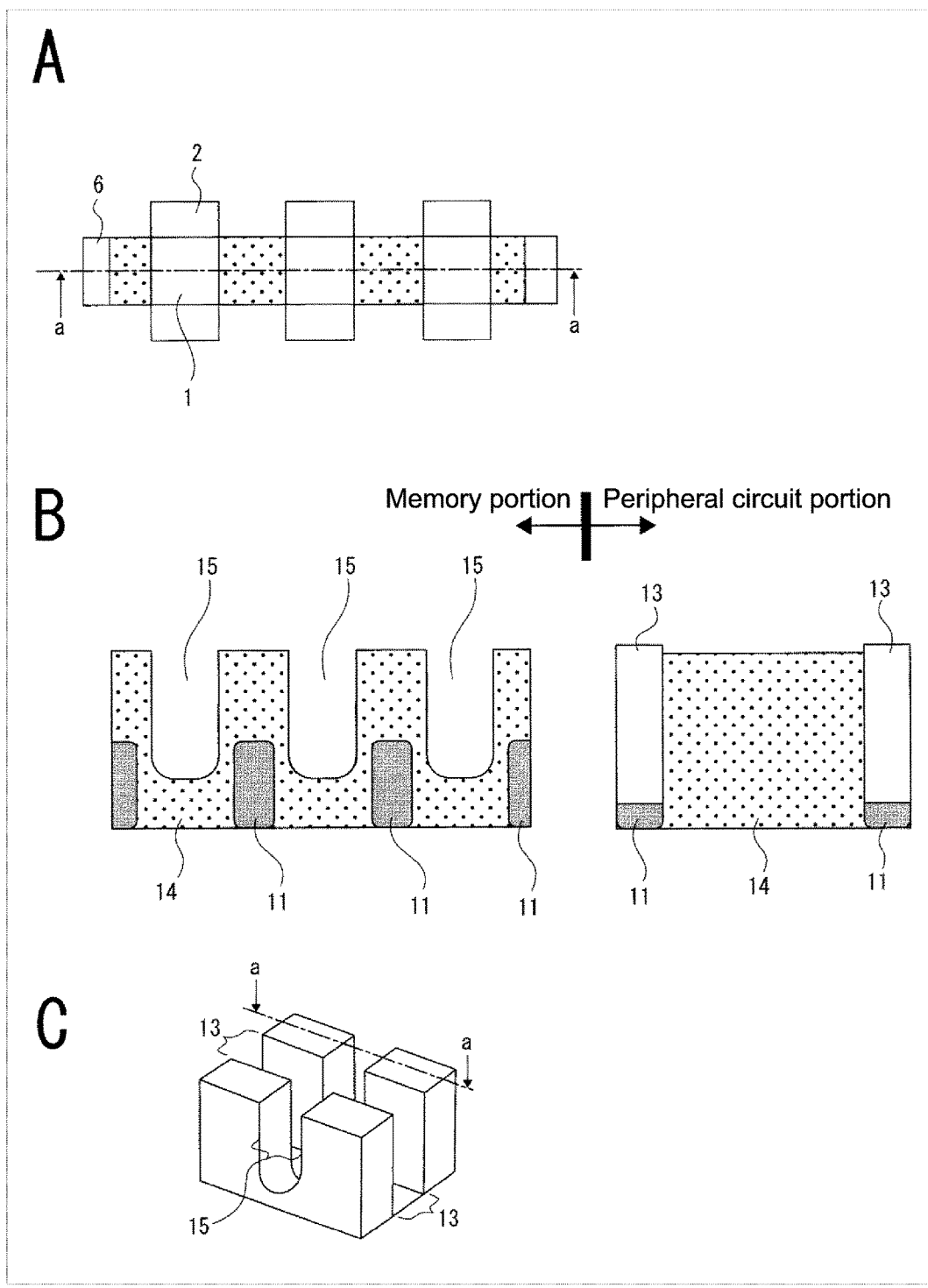
FIG. 6 is a diagram showing a layer structure in a state where a concave portion of the memory cell according to the embodiment is formed.

FIG. 6 is a diagram showing a layer structure in a state where a groove-shaped concave portion 15 of the memory cell according to the embodiment is formed. After the steps described in FIG. 5, the concave portion 15 is formed.

As shown in part B of FIG. 6, the silicon substrate 14 and the field isolation layers 11 are processed by RIE (Reactive Ion Etching) to be formed into the shape of wiring lines in the vertical direction that will be the word lines 2, thus forming groove-shaped concave portions 15. Almost the centers of the sidewall portions on both sides of the silicon substrate 14 in each groove-shaped concave portion become the channels 12 of the access transistor 5 that will be formed in a subsequent step.

As shown in a bird's eye view of part C of FIG. 6, the concave portion 15 and the element isolation region 13 are in an intersecting relationship.

Figure 7:
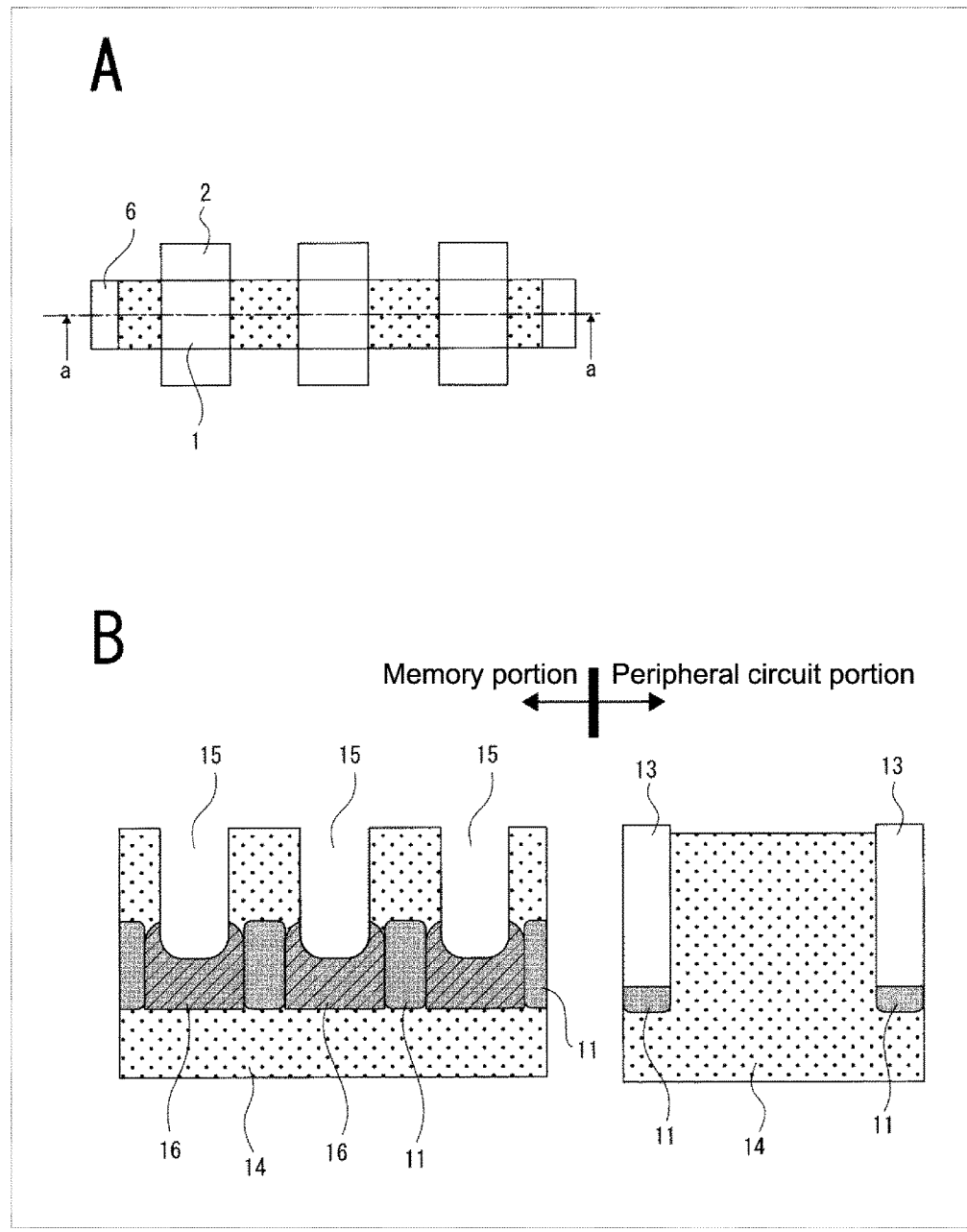
FIG. 7 is a diagram showing a layer structure in a state where a first diffusion layer of the memory cell according to the embodiment is formed.

FIG. 7 is a diagram showing a layer structure in a state where a first diffusion layer of the memory cell according to the embodiment is formed.

As shown in part B of FIG. 7, a first diffusion layer 16 is formed in the bottom portion of the concave portion 15 by ion implantation. This portion corresponds to a portion to be one diffusion layer (drain) of the access transistor 5. Those diffusion layers are electrically isolated from adjacent diffusion layers by the field isolation layers 11 previously formed in FIG. 5. In the direction from the near side to the deep side in the figure, the field isolation layer 11 and the element isolation region 13 provide electrical isolation (insulation).

Figure 8:
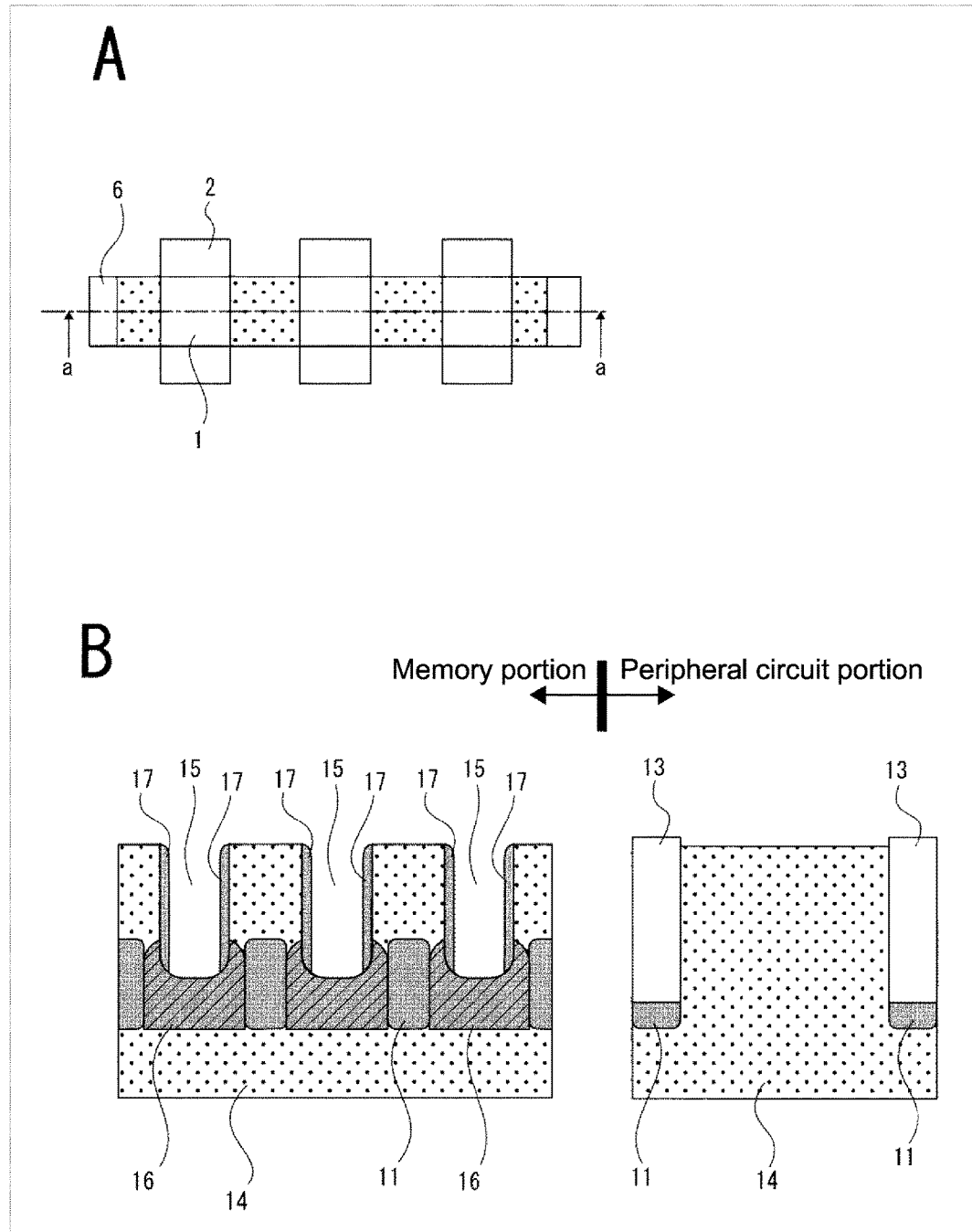
FIG. 8 is a diagram showing a layer structure in a state where protective films are formed within the concave portion of the memory cell according to the embodiment.

It should be noted that, as shown in FIG. 8, it is also conceived to form sidewall protective films 17 on the inner sides of the concave portion 15 of the memory cell 1. When the first diffusion layer 16 is formed by ion implantation in the bottom portion of the concave portion 15, it is necessary to perform high-concentration injection of $1E15/cm^2$ or more. The sidewall protective films 17 are formed to protect the sidewalls, which are to be the channels 12 later, from contamination of the ion implantation.

The sidewall protective films 17 shown in part B of FIG. 8 can be removed by wet processing of preprocessing for gate oxidation of the access transistor 5, which is a later step. The formation of the sidewall protective films 17 is not necessarily an indispensable step in the manufacture of the memory cell according to this embodiment.

Figure 9:
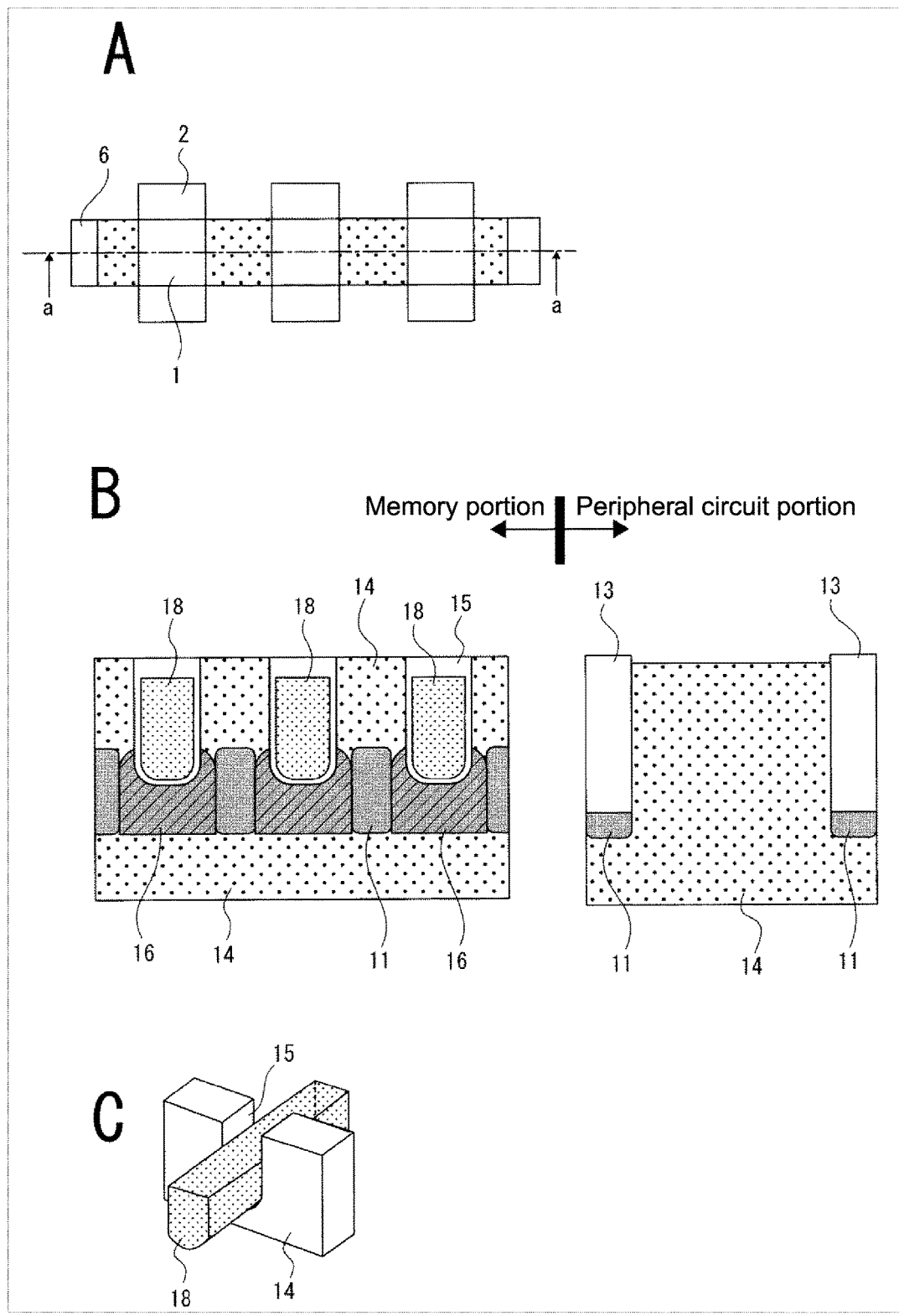
FIG. 9 is a diagram showing a layer structure in a state where a gate electrode is embedded in the memory cell according to the embodiment.

FIG. 9 is a diagram showing a layer structure in a state where a gate electrode is embedded in the memory cell according to the embodiment. A gate electrode 18 is embedded in the state formed in FIG. 7. The structure of FIG. 8 in which the sidewall protective films 17 are formed may be used.

In order to embed the gate electrode 18, first, a gate insulating film is formed on an interior wall of the concave portion 15, and then the gate electrode 18 is embedded along the groove-shaped concave portion 15. At that time, it is desirable that the gate electrode 18 be kept in a lower position than the silicon substrate 14 on the both sides of the gate electrode 18 and the upper portion thereof be made flat. The gate electrode 18 can be made using polysilicon or a metal electrode material, or a composite film of them. The word line 2 is connected to the gate electrode 18.

As shown in a bird's eye view of part C of FIG. 9, the gate electrode 18 is formed along the concave portion 15.

Figure 10:
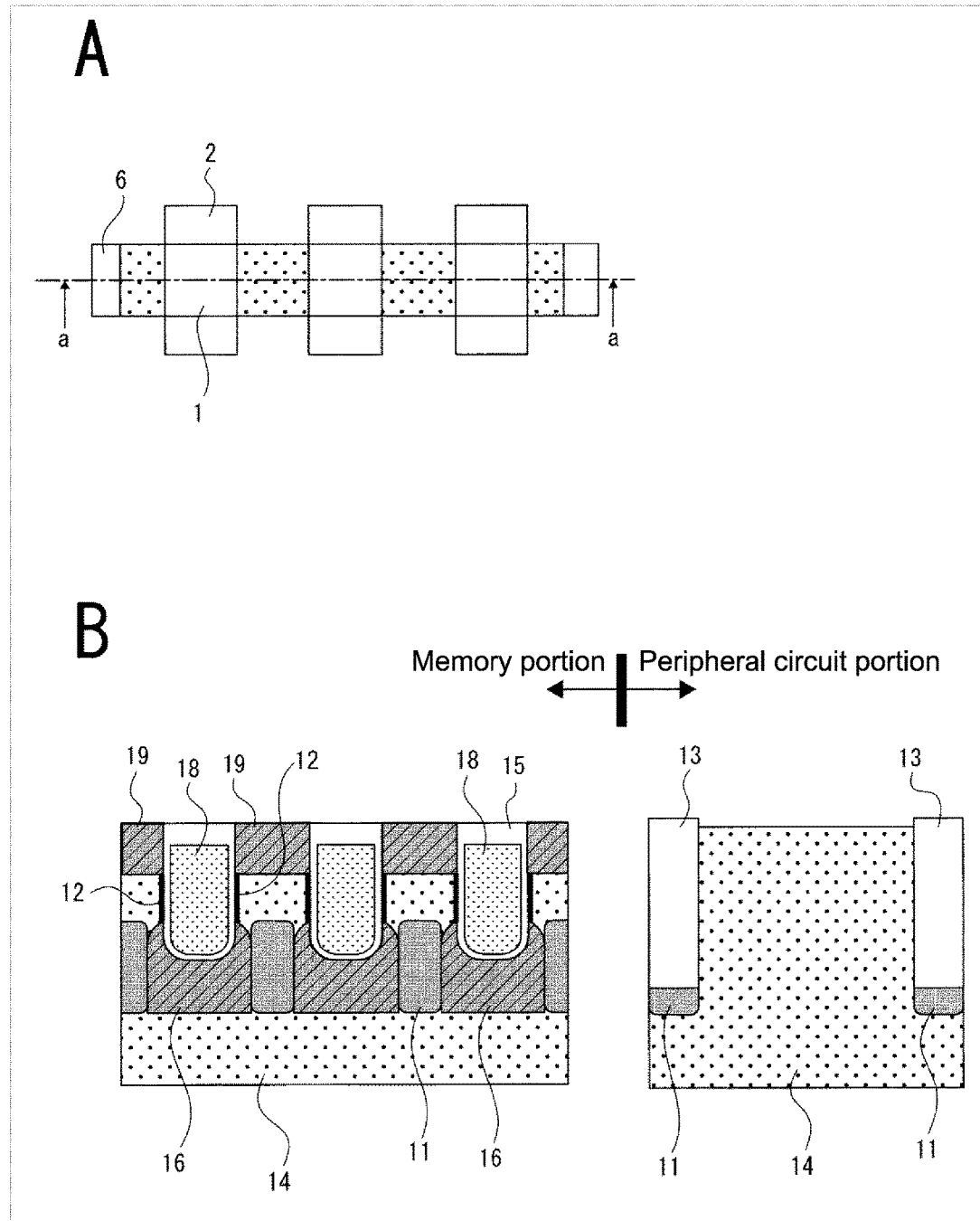
FIG. 10 is a diagram showing a layer structure in a state where a second diffusion layer of the memory cell according to the embodiment is formed.

FIG. 10 is a diagram showing a layer structure in a state where a second diffusion layer of the memory cell according to the embodiment is formed.

As shown in part B of FIG. 10, a second diffusion layer 19 is formed in the upper portion of the silicon substrate 14 by ion implantation. This portion corresponds to a portion to be the other diffusion layer (source) of the access transistor 5.

Figure 11:
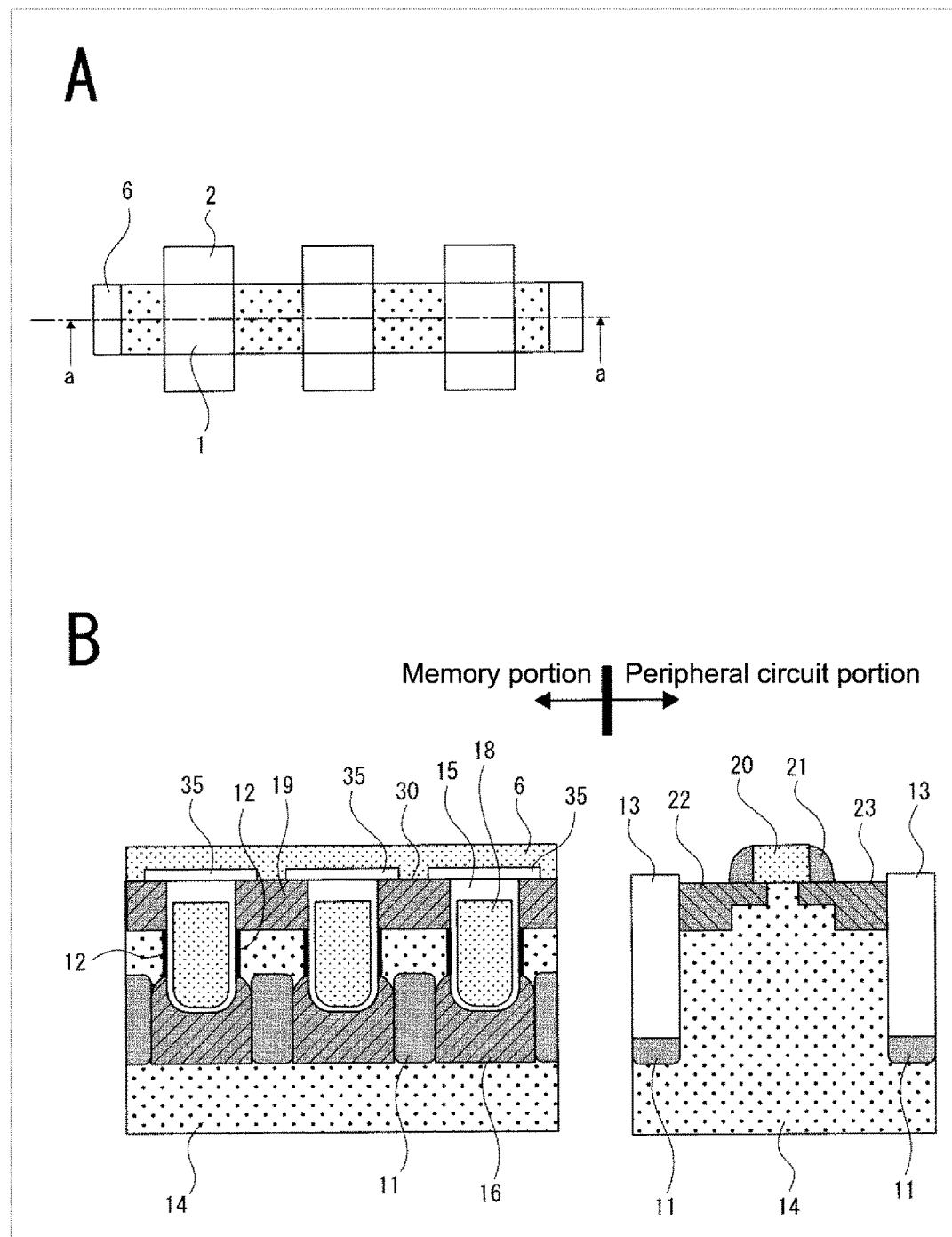
FIG. 11 is a diagram showing a layer structure in a state where the second diffusion layer of the memory cell according to the embodiment and a bit line connected thereto are formed.

FIG. 11 is a diagram showing a layer structure in a state where the second diffusion layer 19 of the memory cell 1 according to the embodiment and a bit line connected thereto are formed. First, after an interlayer film 35 is formed, bit contacts 30 are opened in the upper portion of the memory cell, so that the bit line 6 is wired. The bit contacts 30 are opened and connected as normal contacts to the second diffusion layer 19. Thus, when a voltage is applied to the word line 2, the voltage is applied to the gate electrode 18 connected to the word line 2, and the access transistor 5 corresponding thereto can provide a current from the bit line 6 to the first diffusion layer 16 on the bottom portion of the concave portion 15, with the wall surfaces on the both sides of the gate electrode 18, that is, the sidewalls of the concave portion 15 being as channels.

Before the bit line 6 is formed, in the peripheral circuit portion, transistors each having the structure described with reference to FIG. 3 are formed. The forming method is the same as a manufacturing method for a normal MOS transistor.

Figure 12:
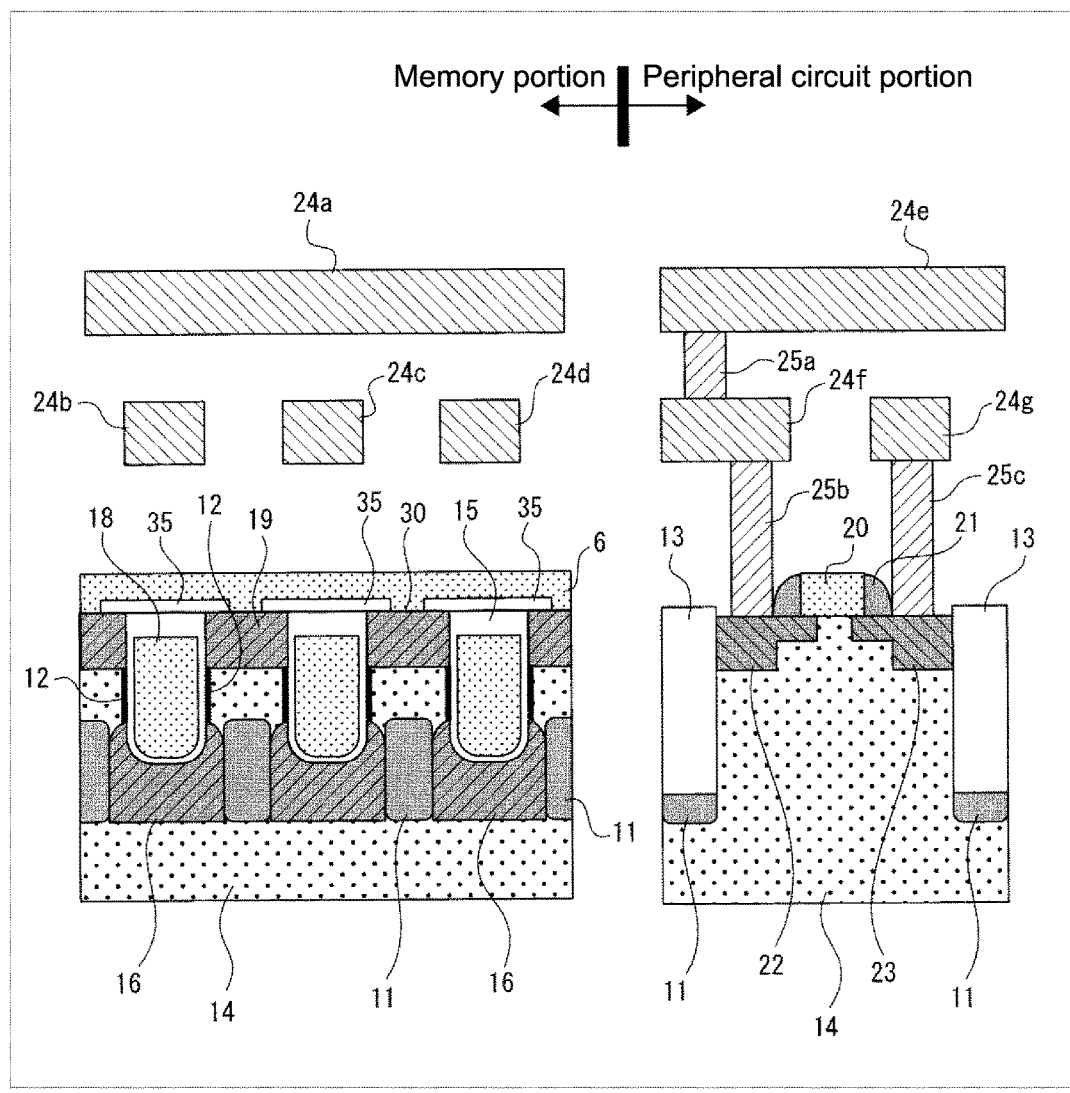
FIG. 12 is a diagram showing a layer structure in a state where metal wires of the memory cell according to the embodiment are formed.

FIG. 12 is a diagram showing a layer structure in a state where metal wires on the upper layer side of the memory cell according to the embodiment are formed. To the method for the metal wires, a wiring forming step used for a normal semiconductor memory device can be applied as it is. After a necessary wiring structure is formed, the upper portion is made flat by CMP (chemical mechanical polishing) or the like, to make a state in which wafer boding can be performed.

Here, metal wires 24a to 24g are power source wires. In general, the metal wires 24a to 24g are made of aluminum or Cu. The metal wires 24b to 24d can be each used as a shunt or the like. Metal wires 25a to 25c connect the wiring layers. In general, the metal wires 25a to 25c are filled with tungsten.

Figure 13:
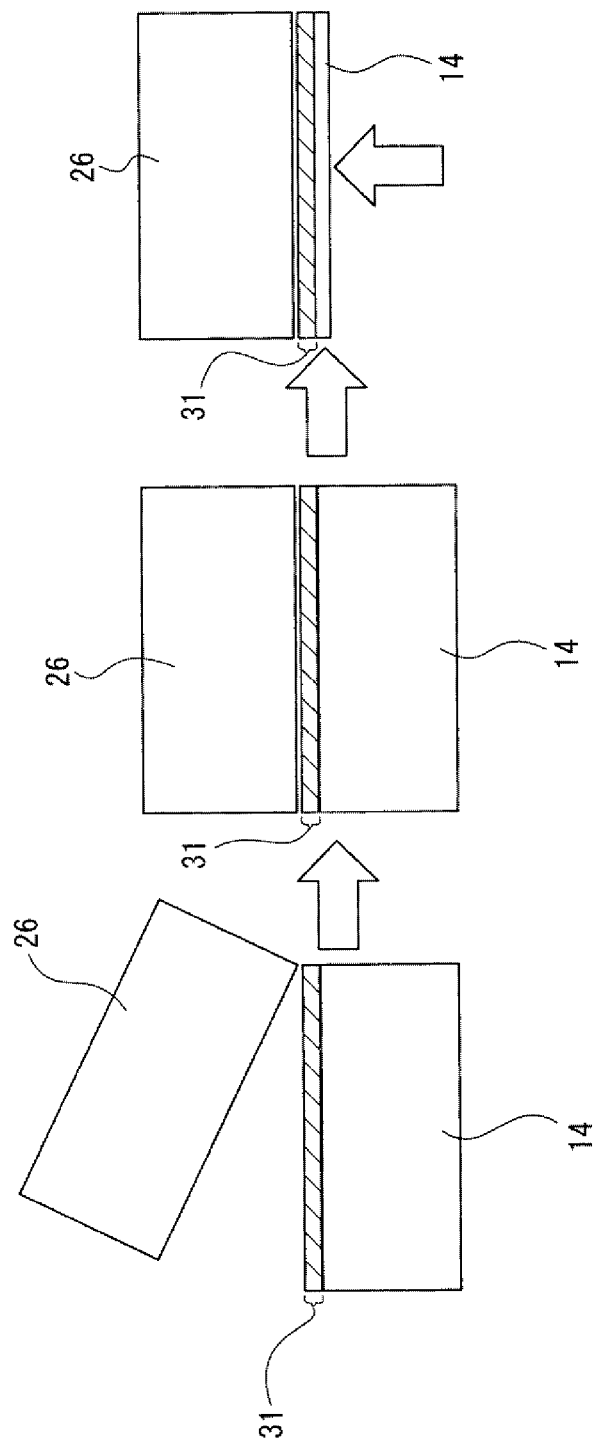
FIG. 13 is a diagram schematically showing a procedure of bonding an intermediate laminated body formed on one substrate to another substrate and performing thinning so as to manufacture the memory cell according to the embodiment.

FIG. 13 is a diagram schematically showing a procedure of bonding an intermediate laminated body 31 formed on one substrate to another substrate and performing thinning so as to manufacture the memory cell according to the embodiment.

The intermediate laminated body 31 represents a structure portion that is formed as a lamination on the silicon substrate 14 by the above-mentioned procedure to FIG. 12.

The upper portion of the silicon substrate 14 on which the intermediate laminated body 31 is formed is made flat, and another silicon substrate 26 that serves as a support substrate for maintaining rigidity is bonded thereto (see the left part and the center part of FIG. 13). The silicon substrate 26 is a simple substrate on which a laminated structure is not particularly formed.

After the silicon substrate 26 is bonded, the silicon substrate 14 is polished from its back surface (surface on which the intermediate laminated body 31 is not formed) to be thinned (see the right part).

In the present disclosure, thinning is performed up to approximately 0.5 μm to 1.5 μm, for example.

For example, the technology used for a backside illumination image sensor can be applied to the series of bonding/thinning step.

Figure 14:
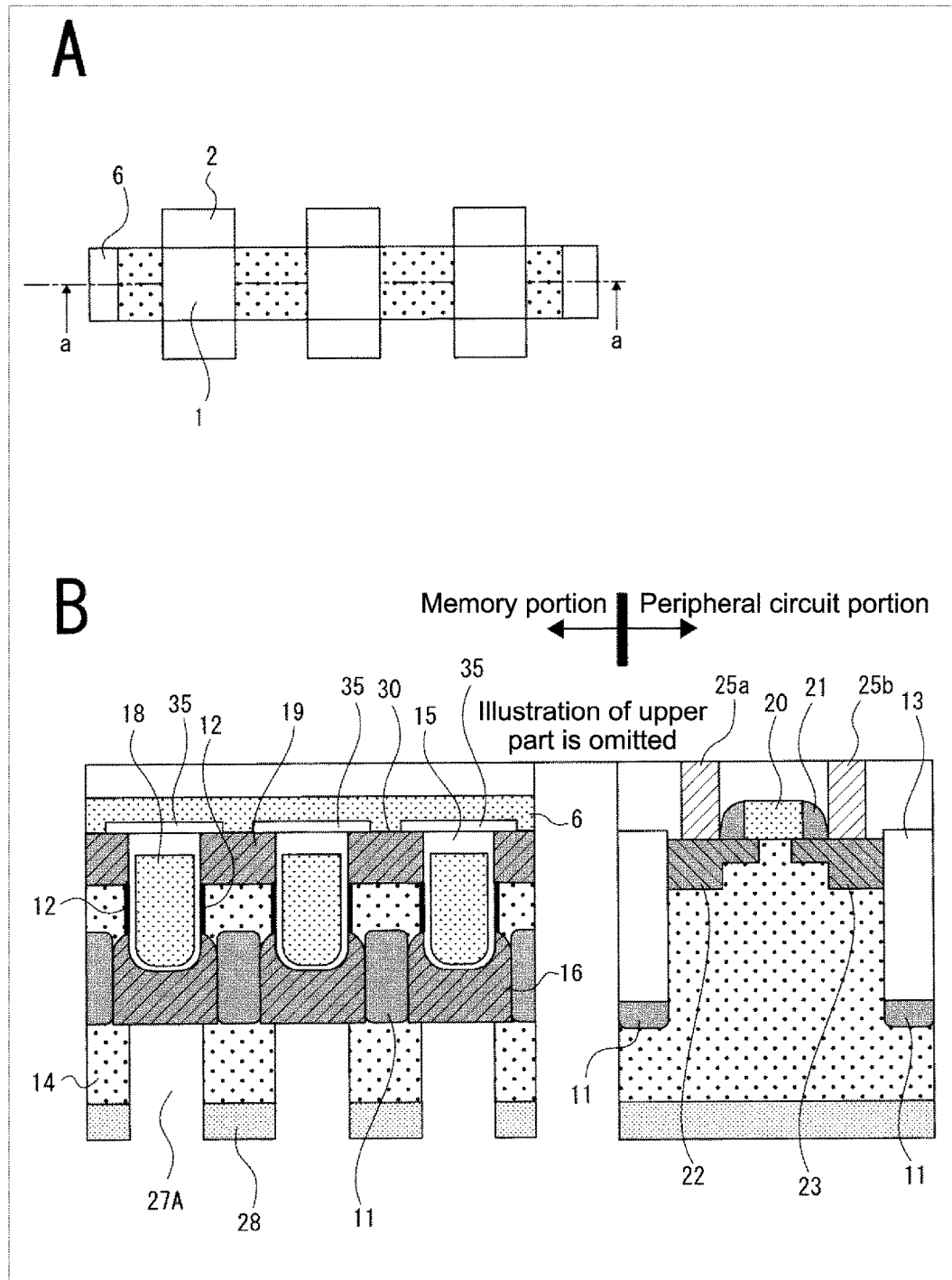
FIG. 14 is a diagram showing a layer structure in which a back contact is formed from the first diffusion layer of the intermediate laminated body of the memory cell according to the embodiment.

FIG. 14 is a diagram showing a layer structure in which a back contact opening 27A is formed from the first diffusion layer 16 of the intermediate laminated body 31 of the memory cell 1 according to the embodiment. As shown in FIG. 12, the metal wires 24 and the bonded silicon substrate 26 for a support substrate are present on the upper portion of the bit line 6, but illustration thereof is omitted hereinafter in FIGS. 14, 15, and 16.

Further, the silicon substrate is replaced with the upper-part silicon substrate 26 omitted in the figure. Thus, in actual processes, process formulation proceeds on the basis of a wafer in an upside-down state with respect to one shown in the figure.

After the back surface of the silicon substrate 14 is thinned, a back insulating film is deposited, and a minute back contact opening 27A is formed, from the back surface, in the first diffusion layer 16 previously formed. When the back contact opening 27A is formed, the RIE is stopped at a depth that enables sufficient contact to the first diffusion layer 16.

Figure 15:
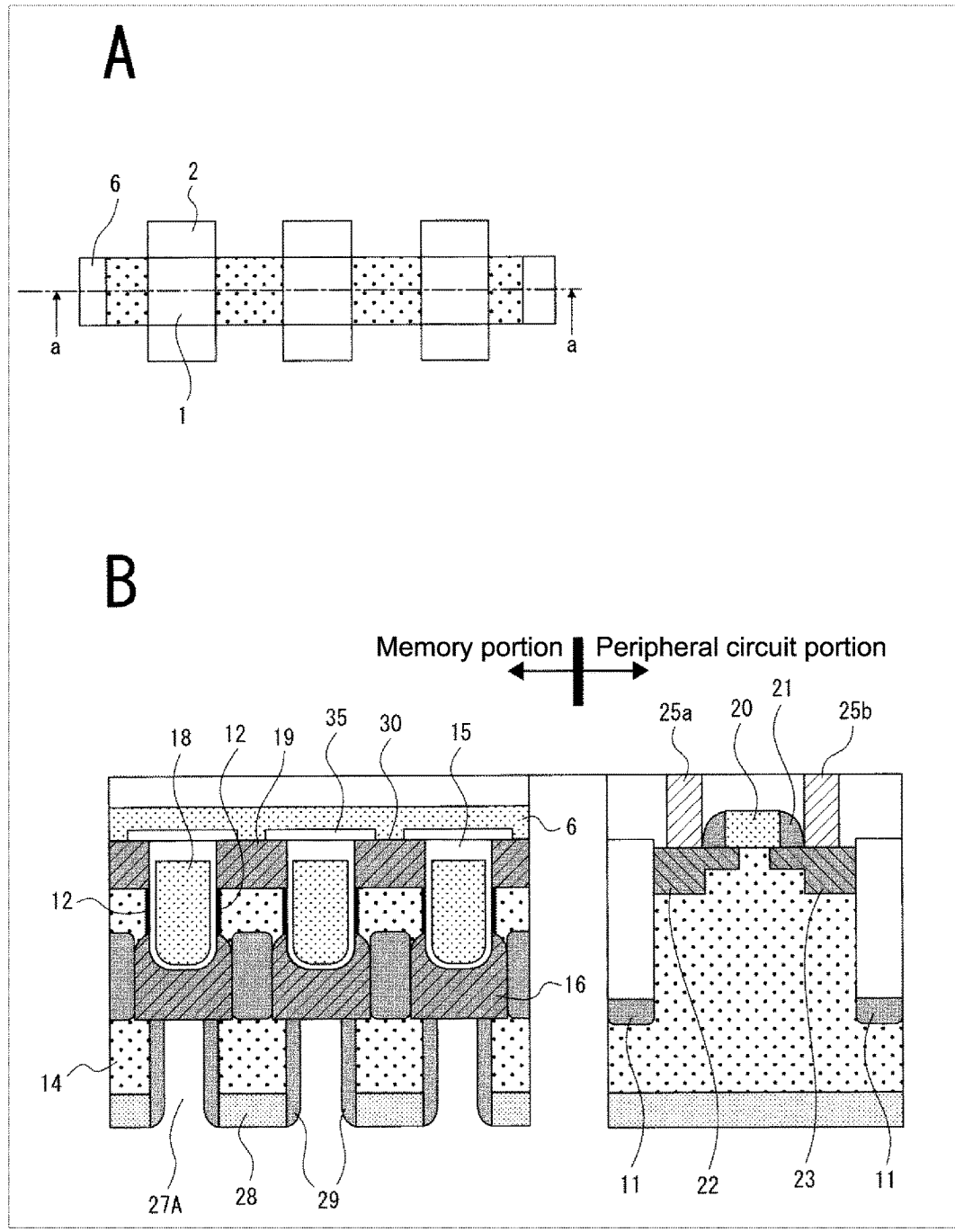
FIG. 15 is a diagram showing a layer structure in which insulating protective films are formed on sidewalls of the back contact formed from the first diffusion layer of an intermediate laminated area of the memory cell according to the embodiment.

FIG. 15 is a diagram showing a layer structure in which insulating protective films 29 are formed on sidewalls of the back contact opening 27A formed from the first diffusion layer 16 of the intermediate laminated body 31 of the memory cell according to the embodiment.

The protective insulating films 29 are formed on the sidewalls of the back contact opening 27A previously formed. This can prevent the back contact 27 that will be described later from short-circuiting with the silicon substrate 14. If this insulation is insufficient, an operation failure may occur or performance as the memory cell may be impaired.

After the above steps are performed, the structure shown in FIG. 3 is formed and the memory cell 1 is completed.

Namely, the back contact 27 as a conductor is disposed in the back contact opening 27A, and connection is extracted from the back contact 27. The MTJ element 3 is thus formed as a memory element electrically connected to the first diffusion layer 16 by the back contact 27.

The back contact 27 is conceived as a copper plug, a tungsten plug, or the like. It is desirable that an electrical connection point from the first diffusion layer 16 be extracted at low resistance.

As described above, the back contact 27 has a relatively low aspect ratio and is directly drawn from the first diffusion layer 16 corresponding to the drain of the access transistor 5, and thus resistance that is about ¼ to ⅕ lower than that of a general structure can be expected.

The formation of the MTJ element 3 is performed on the back, flat silicon substrate. So, the structure that is easy to be processed is provided. The data line 4 is disposed above the MTJ element 3. The data line 4 only needs to be a wire running parallel to the bit line 6, and does not involve an increase in cell area. Further, after the MTJ element 3 is formed, process construction by low-heat processing is enabled, and characteristics of a memory element of the MTJ element 3 after the MTJ element 3 is formed are not imparted.

By the procedure described above, the memory cell according to this embodiment can be manufactured.

With the memory cell structure formed as described above according to this embodiment, the access transistor 5 has the two opposing sidewall portions of the concave portion 15 as channels, and thus the channel width more than twice as large as a normal transistor can be ensured. This can increase a current-driving capability without causing an increase in cell area. In order to increase coercive characteristics of the MTJ element 3, it is desirable to provide a relatively large current at a low voltage. So, it is effective to increase a current-driving capability of the access transistor 5.

Further, in the transistor, a source-drain current path is formed in a perpendicular direction, the second diffusion layer 19 and the bit line 6 are connected to each other, and the first diffusion layer 16 is connected to the MTJ element 3 via one back contact 27.

Normally, the MTJ element has low heat resistance as a material. So, in the step of manufacturing a cell structure, the heat treatment performed after the MTJ element is formed is intended to be minimized. For that reason, in various memory cell structures, the following technique is adopted: a transistor portion, a metal wire portion, and the like are formed, and then MTJ elements are formed thereon. However, by this technique, the connection from the transistor to the MTJ element is provided via a large number of contacts. This increases a resistance value by the contacts. In the case of this embodiment, since the MTJ element 3 is formed on the back side of the silicon substrate 14 on which the access transistor 5 is formed, and the first diffusion layer 16 is thus connected to the MTJ element 3 via one back contact 27, the resistance by the contacts is minimized, and this embodiment is advantageous in terms of this point as well. Moreover, the MTJ element 3 can be created in a step after the metal wire step, and the influence of the heat treatment on the MTJ element 3 can be minimized.

5. Modified Example

Hereinafter, a modified example of the memory cell structure according to the embodiment will be described with reference to FIG. 16. FIG. 16 is a diagram showing a modified example of the memory cell structure according to the embodiment. An SOI (silicon on insulator) substrate 33 is used instead of a normal silicon substrate.

The SOI substrate is a substrate having a structure in which $SiO_2$ is inserted between a silicon substrate and a surface Si layer. In general, the SOI substrate is said to be effective in improvement in operating speed and reduction in power consumption, because a parasitic capacitance of a transistor can be reduced. Compared with a case of using a normal silicon substrate, it is said that improvement of 20% to 30% in the operating speed and reduction of 50% or more in power consumption can be expected.

As shown in FIG. 16, the memory cell structure is substantially the same as the memory cell structure manufactured using the normal silicon substrate 14. The memory cell structure of FIG. 16 is different in that the protective insulating films 29 (see FIG. 3) formed on the sidewalls of the back contact 27 are not present. In other words, in the case of using the SOI substrate 33, insulation between the memory cells 1 can be ensured without the protective insulating films 29, and thus it is unnecessary to form the protective insulating films 29.

In the back contact 27, a contact smaller than a minimum design can be formed by the sidewall process. So, sidewalls 34 are formed at end portions in which the back contact 27 is narrowed.

Advantages in the case of using the SOI substrate 33 are as follows.

(a) In the normal silicon substrate 14, it is indispensable to form a uniform thin silicon substrate 14 including the memory cell 1, whereas this is not needed in the case of the SOI substrate.

(b) In the normal silicon substrate 14, the depth tends to be larger to some extent due to a margin of a film thickness of the silicon substrate of the back contact 27, whereas the depth does not become larger in the case of the SOI substrate.

(c) In the normal silicon substrate 14, it is difficult to stop RIE at high accuracy at a position of the first diffusion layer 16 when a back contact is opened, whereas the RIE can be stopped at high accuracy in the case of the SOI substrate.

(d) In the normal silicon substrate 14, the protective insulating films 29 are required on the sidewalls in order to prevent the back contact 27 and the silicon substrate 14 from short-circuiting, whereas the protective insulating films 29 are not required in the case of the SOI substrate.

As described above, in the case where the SOI substrate 33 is used, excellent advantages are exhibited. The method of manufacturing the memory cell is similar to the case of the normal silicon substrate 14.

The memory cell structure and the method of manufacturing the same according to the embodiment described above are not limited to those for the MRAM, and can be applied to a memory such as a DRAM.

It should be noted that the effects described herein are merely exemplary ones and are not restrictive ones, and any other effects may be produced.

It should be noted that the present technology can have the following configurations.

(1) A memory cell structure, including:
a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions; and
a memory element that is disposed below the first diffusion layer,
the first diffusion layer being electrically connected to the memory element via a contact formed after the silicon substrate is thinned.

(2) The memory cell structure according to (1), in which
the first diffusion layer is electrically insulated by an insulating film and a substrate concentration profile for each memory cell.

(3) The memory cell structure according to (1) or (2), in which
the contact has a structure insulated from the silicon substrate.

(4) The memory cell structure according to any one of (1) to (3), in which the silicon substrate is an SOI substrate.

(5) The memory cell structure according to any one of (1) to (4), in which
the memory element is an MTJ element.

(6) A method of manufacturing a memory having a memory cell structure including a transistor and a memory element, the transistor using a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, the memory element being disposed below the first diffusion layer, the first diffusion layer being electrically connected to the memory element via a contact formed after the silicon substrate is thinned, the method including the step of forming an intermediate laminated body as a part of the memory cell structure by performing at least the steps of:
forming field isolation layers at a predetermined depth of the silicon substrate;
forming the groove-shaped concave portion between the field isolation layers;
forming the first diffusion layer in the bottom portion of the concave portion;
forming the second diffusion layer in the upper end portions of the sidewall portions of the concave portion; and
forming a metal wire in an upper portion of the second diffusion layer.

(7) The method of manufacturing a memory according to (6), including the steps of:
bonding another silicon substrate as a support substrate to the silicon substrate on which the intermediate laminated body is formed; and
thinning the silicon substrate.

(8) The method of manufacturing a memory according to (7), including the step of
forming a contact from the first diffusion layer formed on the thinned silicon substrate.

(9) The method of manufacturing a memory according to (8), including the step of
forming a memory element electrically connected to the first diffusion layer by the contact.

(10) A memory apparatus, including:
a memory cell including a memory element that holds information depending on a magnetization state of a magnetic body; and
two types of wires mutually intersect and other types of wires,
the memory cell having a memory cell structure including
a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, and
the memory element that is disposed below the first diffusion layer, the first diffusion layer being electrically connected to the memory element via a contact formed after the silicon substrate is thinned,
the memory element being provided to a current between the two types of wires via the transistor.

DESCRIPTION OF SYMBOLS 1, 10 memory cell
2 word line

3 MTJ
4 data line
5 access transistor
6 bit line
7 capacitor
11 field isolation layer
12 channel
13 element isolation region
14, 26 silicon substrate
15 concave portion
16 diffusion layer
17 sidewall protective film
18, 20 gate electrode
19 second diffusion layer
27 back contact
28 back insulating layer
29 protective insulating film
31 intermediate laminated body
33 SOI substrate

What is claimed is:

1. A memory cell structure, comprising:
a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions; and
a memory element that is disposed below the first diffusion layer,
the first diffusion layer being electrically connected to the memory element via a contact formed after the silicon substrate is thinned.

2. The memory cell structure according to claim 1, wherein
the first diffusion layer is electrically insulated by an insulating film and a substrate concentration profile for each memory cell.

3. The memory cell structure according to claim 1, wherein the contact has a structure insulated from the silicon substrate.

4. The memory cell structure according to claim 1, wherein the silicon substrate is an SOI substrate.

5. The memory cell structure according to claim 1, wherein the memory element is an MTJ element.

6. A method of manufacturing a memory having a memory cell structure including a transistor and a memory element, the transistor using a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, the memory element being disposed below the first diffusion layer, the first diffusion layer being electrically connected to the memory element via a contact formed after the silicon substrate is thinned,
the method comprising the step of forming an intermediate laminated body as a part of the memory cell structure by performing at least the steps of:
forming field isolation layers at a predetermined depth of the silicon substrate;
forming the groove-shaped concave portion between the field isolation layers;
forming the first diffusion layer in the bottom portion of the concave portion;
forming the second diffusion layer in the upper end portions of the sidewall portions of the concave portion; and
forming a metal wire in an upper portion of the second diffusion layer.

7. The method of manufacturing a memory according to claim 6, further comprising the steps of:
bonding another silicon substrate as a support substrate to the silicon substrate on which the intermediate laminated body is formed; and
thinning the silicon substrate.

8. The method of manufacturing a memory according to claim 7, further comprising the step of
forming a contact from the first diffusion layer formed on the thinned silicon substrate.

9. The method of manufacturing a memory according to claim 8, comprising the step of
forming a memory element electrically connected to the first diffusion layer by the contact.

10. A memory apparatus, comprising:
a memory cell including a memory element that holds information depending on a magnetization state of a magnetic body; and
two types of wires that mutually intersect and other types of wires,
the memory cell having a memory cell structure including a transistor that uses a first diffusion layer formed in a bottom portion of a concave portion formed by processing a silicon substrate into a groove shape, and a second diffusion layer formed in upper end portions of two opposing sidewall portions of the concave portion, to form channels at portions between the first diffusion layer and the second diffusion layer in the two sidewall portions, and
the memory element that is disposed below the first diffusion layer, the first diffusion layer being electrically connected to the memory element via a contact formed after the silicon substrate is thinned,
the memory element being provided to a current between the two types of wires via the transistor.

* * * * *